(12) United States Patent
Aga et al.

(10) Patent No.: US 6,238,990 B1
(45) Date of Patent: *May 29, 2001

(54) METHOD FOR HEAT TREATMENT OF SOI WAFER AND SOI WAFER HEAT-TREATED BY THE METHOD

(75) Inventors: Hiroji Aga; Norihiro Kobayashi; Kiyoshi Mitani, all of Gunma-ken (JP)

(73) Assignee: Shin-Etsu Handotai, Co., Ltd., Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/185,901

(22) Filed: Nov. 4, 1998

(30) Foreign Application Priority Data

Nov. 5, 1997 (JP) .................................................. 9-318896

(51) Int. Cl.$^7$ ...................... H02L 21/336; H02L 21/00; H02L 21/84; H02L 21/335
(52) U.S. Cl. ........................ 438/308; 438/143; 438/151
(58) Field of Search .................................. 438/149, 150, 438/151, 155, 308

(56) References Cited

U.S. PATENT DOCUMENTS

| | | | |
|---|---|---|---|
| 4,682,407 | * 7/1987 | Wilson et al. | 29/576 |
| 5,471,944 | * 12/1995 | Sato | 117/84 |
| 5,792,699 | * 8/1998 | Tsui | 438/290 |
| 5,827,772 | * 10/1998 | Nakamura | 438/486 |
| 5,955,178 | * 9/1999 | Orita et al. | 428/210 |
| 5,966,620 | * 10/1999 | Sakaguchi et al. | 438/455 |

FOREIGN PATENT DOCUMENTS

| | | | | |
|---|---|---|---|---|
| 5217821 | 8/1993 | (JP) | | H01L/21/02 |
| 10084100 | 3/1998 | (JP) | | H01L/27/12 |

* cited by examiner

Primary Examiner—Jey Tsai
Assistant Examiner—Viktor Simkovic
(74) Attorney, Agent, or Firm—Hogan & Hartson, LLP

(57) ABSTRACT

A method for heat-treating an SOI wafer in a reducing atmosphere, wherein the SOI wafer is heat-treated through use of a rapid thermal annealer at a temperature within the range of 1100° C. to 1300° C. for 1 sec to 60 sec. The reducing atmosphere is preferably an atmosphere of 100% hydrogen or a mixed gas atmosphere containing hydrogen and argon. The heat treatment is preferably performed for 1 sec to 30 sec. The method eliminates COPs in an SOI layer of an SOI wafer in accordance with a hydrogen annealing method, while preventing etching of the SOI layer and a buried oxide layer.

4 Claims, 2 Drawing Sheets

METHOD FOR HEAT TREATMENT OF SOI WAFER AND SOI WAFER HEAT-TREATED BY THE METHOD

BACKGROUND OF THE INVENTION

1. Field of the Invention

The present invention relates to a method for heat treatment of an SOI wafer, and particularly to a method for heat treatment capable of reducing crystal originated particle (hereinafter referred to as COP) density in the surface of an SOI layer while preventing etching of the SOI layer and a buried oxide layer.

2. Description of the Related Art

There has been proposed a technique such that an SOI (Silicon on Insulator) wafer is heat-treated at 500–1200° C. in a reducing atmosphere of 200 Torr or less in order to improve the surface roughness of the SOI wafer (see Japanese Patent Application Laid-Open (kokai) No. 5-217821). This patent publication states that when an SOI wafer is heat-treated at 950° C. in a hydrogen atmosphere of 80 Torr or less, the surface roughness of the SOI layer is improved from 20 nm to 1.5 nm.

In this case, the SOI layer of the SOI wafer is formed from an epitaxial layer.

Meanwhile, through performing experiments, the inventors of the present invention found that in an SOI wafer whose SOI layer is formed from a silicon wafer produced in accordance with the CZ (Czochralski method), when the SOI wafer undergoes hydrogen annealing at a high temperature of 1150° for a long time of 180 minutes in accordance with the conventional method, silicon of the active layer (SOI layer) of the SOI wafer is etched by an amount of 0.5 μm and etch pits are formed in a buried oxide layer. They also found that defects such as COPs (Crystals Originated Particles) are present in the SOI layer and that when such defects extend to a substrate oxide film, there occurs a disadvantageous phenomenon such that the COPs remain uneliminated or may even expand and that the buried oxide layer is etched by hydrogen that invades into the oxide layer through defects, resulting in formation of pits and adversely affecting the active layer in the vicinity thereof.

In order to counter the effects of such a phenomenon, the applicant of the present invention has proposed a technique in which heat treatment is performed in a state in which an SOI layer has a thickness greater than 0.5 μm (see Japanese Patent Application Laid-Open (kokai) No. 10-84100. This method has a drawback of necessity for a step of reducing the thickness of the SOI layer after heat treatment in order to obtain an SOI layer having a thickness of 0.5 μm or less.

Also, there was proposed a method in which a Si epitaxial layer is grown on a silicon wafer, which is then bonded to another wafer in order to use the epitaxial layer as an SOI layer. This method can reliably eliminate defects but greatly increases production costs.

Further, the above-described hydrogen annealing method is described as requiring at least one hour for high temperature heat treatment, with the result that the productivity is low. Further, since the heat treatment is performed in a batch scheme using a vertical type furnace, a large amount of hydrogen must be caused to flow through the furnace, thereby increasing danger involved in the use of hydrogen.

Meanwhile, presence of COPs has recently been reported to be a cause of decreasing the yield of a device fabricating process. COPs are one kind of crystal defect introduced during crystal growth and are known to have a regular octahedral structure.

When a mirror-polished silicon wafer is cleaned through use of a mixture solution comprising ammonium and hydrogen peroxide, pits are formed on the surface of the wafer. When particles on the thus-cleaned wafer are counted through use of a particle counter, in addition to real particles present on the wafer surface, pits are counted as particles. Such pits are called "COPs" in order to distinguish them from the real particles.

COPs present in the SOI layer of an SOI wafer cause degradation of electrical characteristics of the wafer.

For example, a reliability test which is the important electrical characteristics of a device, especially the time dependent dielectric breakdown (TDDB) of oxide film, relate to COPs, and therefore COPs must be decreased in order to improve TDDB.

Also, COPs are said to affect the time zero dielectric breakdown (TZDB) of oxide film.

Further, COPs are said to adversely affect a device fabrication process. That is, if COPs are present on the surface of an SOI wafer, steps are formed during a wiring process, which causes breakage of wires, resulting in decreased yield.

SUMMARY OF THE INVENTION

The present invention has been accomplished to solve the above-mentioned problems, and an object of the invention is to provide a method for heat treatment which eliminates COPs in an SOI layer in accordance with a hydrogen annealing method, while preventing etching of the SOI layer and a buried oxide layer; i.e., formation of pits.

Another object of the present invention is to provide a method for heat treatment which improves not only TZDB of oxide film but also other electrical characteristics such as TDDB, and which also improves productivity and decreases an amount of hydrogen gas to be used and production costs.

To achieve the above objects, the present invention provides a method for heat-treating an SOI wafer in a reducing atmosphere, characterized in that the silicon wafer is heat-treated through use of a rapid thermal annealer (RTA) at a temperature within the range of 1100° C. to 1300° C. for 1 sec to 60 sec.

The rapid thermal annealing can be performed by a method in which a wafer is rapidly placed into a heat treatment furnace whose temperature has been set to fall within the above temperature range, and, immediately after the elapse of the above heat treatment time, the wafer is rapidly taken out from the furnace, or a method in which a silicon wafer is brought to a predetermined position within a heat treatment furnace and is then rapidly heated by a heater such as a lamp heater. The description "a wafer is rapidly placed into a heat treatment furnace and is rapidly taken out from the furnace after heat treatment" means that the wafer is placed into the heat treatment furnace and taken out from the furnace, without performance of conventional control in which the temperature of a heat treatment furnace is increased and decreased over a predetermined time or in which the wafer is slowly loaded into and unloaded from the heat treatment furnace. Of course, transferring the wafer to a predetermined position within a furnace takes a certain time, which ranges from several seconds to several minutes depending on the capability of a wafer transfer apparatus.

As described above, when a wafer is quickly heated through use of an RTA in a reducing atmosphere at a higher temperature for a shorter period of time as compared to conventional methods, COPs can be reduced greatly, without an SOI layer or a buried oxide layer being etched, in order to improve not only TZDB of oxide film but also other electrical characteristics such as TDDB.

The heat treatment is preferably performed in an atmosphere of 100% hydrogen or in a mixed gas atmosphere of hydrogen and argon. In this case, COPs are decreased more effectively, while the SOI layer or the buried oxide layer is prevented from being etched.

Further, in the present invention, the heat treatment time can be shortened to 1–30 seconds, which is shorter as compared with the time required for the conventional method. Since the heat treatment is performed at high temperature, COPs can be decreased sufficiently through heat treatment for a period as long as 30 seconds. Further, since the treatment time is short, neither the SOI layer nor the buried oxide layer is etched.

The present invention also provides an SOI wafer that has undergone the heat treatment of the invention. Due to the heat treatment, the COP density of the SOI layer of the SOI wafer decreases from, for example, 10 particles/$cm^2$ to 0.1 particles/$cm^2$. Therefore, there can be obtained an SOI wafer whose SOI layer and buried oxide layer are not etched, so that device characteristics and yield are improved.

In the present invention, an SOI wafer is heat-treated by use of an RTA such that the SOI wafer is heat-treated in a reducing mixture-gas atmosphere at a high temperature. Therefore, the number of COPs in the surface layer portion of the SOI layer can be decreased greatly. As a result, there can be obtained an SOI wafer having excellent electrical characteristics. That is, even when COPs are introduced into a wafer during monocrystal growth or subsequent heat treatment, the heat treatment of the invention eliminates thus-introduced COPs. Further, since neither the SOI layer nor the buried oxide layer is etched and both layers maintain the respective film thicknesses they had before the heat treatment, the SOI wafer can exhibit the designed device characteristics.

In contrast with the conventional batch type heat treatment, the heat treatment according to the present invention utilizes a single-wafer type RTA, so that a wafer can be heat-treated within a short period of time to thereby provide a mass-producing effect. Further, since the amount of hydrogen gas to be used decreases, safety in relation to operation can be secured.

DESCRIPTION OF THE INVENTION AND PREFERRED EMBODIMENT

The present invention will next be described in detail.

The inventors of the present invention experimentally studied heat treatment conditions for SOI wafers in an attempt to obtain heat treatment conditions capable of reducing the density of COPs present on the surface of an SOI layer while preventing etching of the SOI layer and a buried oxide layer, and found that when an SOI wafer is heat-treated within a very short period of time in a reducing atmosphere in a temperature range higher than that used in conventional techniques, the COP density of the SOI wafer decreases, and neither the SOI layer nor the buried oxide layer is etched; i.e., no pits are formed. The present invention was accomplished based on this finding.

That is, COPs can be reduced greatly when an SOI wafer is heat-treated by use of an RTA such that the SOI wafer is placed in a reducing atmosphere of 100% hydrogen or a mixed gas atmosphere comprising hydrogen and argon at a temperature within the range of 1100° C. to 1300° C. for 1 sec to 60 sec, preferably 1 sec to 30 sec. The above heat treatment conditions enable reduction of the COP density of the SOI wafer to substantially zero. If the density of COPs on the surface of the SOI layer of an SOI wafer can be decreased to about 1 particle/$cm^2$, not only TZDB of oxide film but also other electrical characteristics such as TDDB are improved.

Further, in the SOI wafer produced in accordance with the method of the present invention, since neither the SOI layer nor the buried oxide layer is etched and both layers maintain the respective film thicknesses they had before the heat treatment, the SOI wafer can exhibit the designed device characteristics.

Since an RTA is used, a wafer can be heat-treated within a short period of time to thereby improve productivity. Further, since the amount of hydrogen gas to be used decreases, safety in relation to operation can be secured.

An embodiment of the present invention will next be described with reference to the drawings. However, the present invention is not limited thereto.

In the present invention, an RTA is used for heat treatment of SOI wafers. Examples of such an RTA include conventional heat-radiation-type lamp heaters and commercially available apparatus, such as SHS-2800, product of AST Corp. These apparatus are neither very complex nor expensive.

Figure 3:
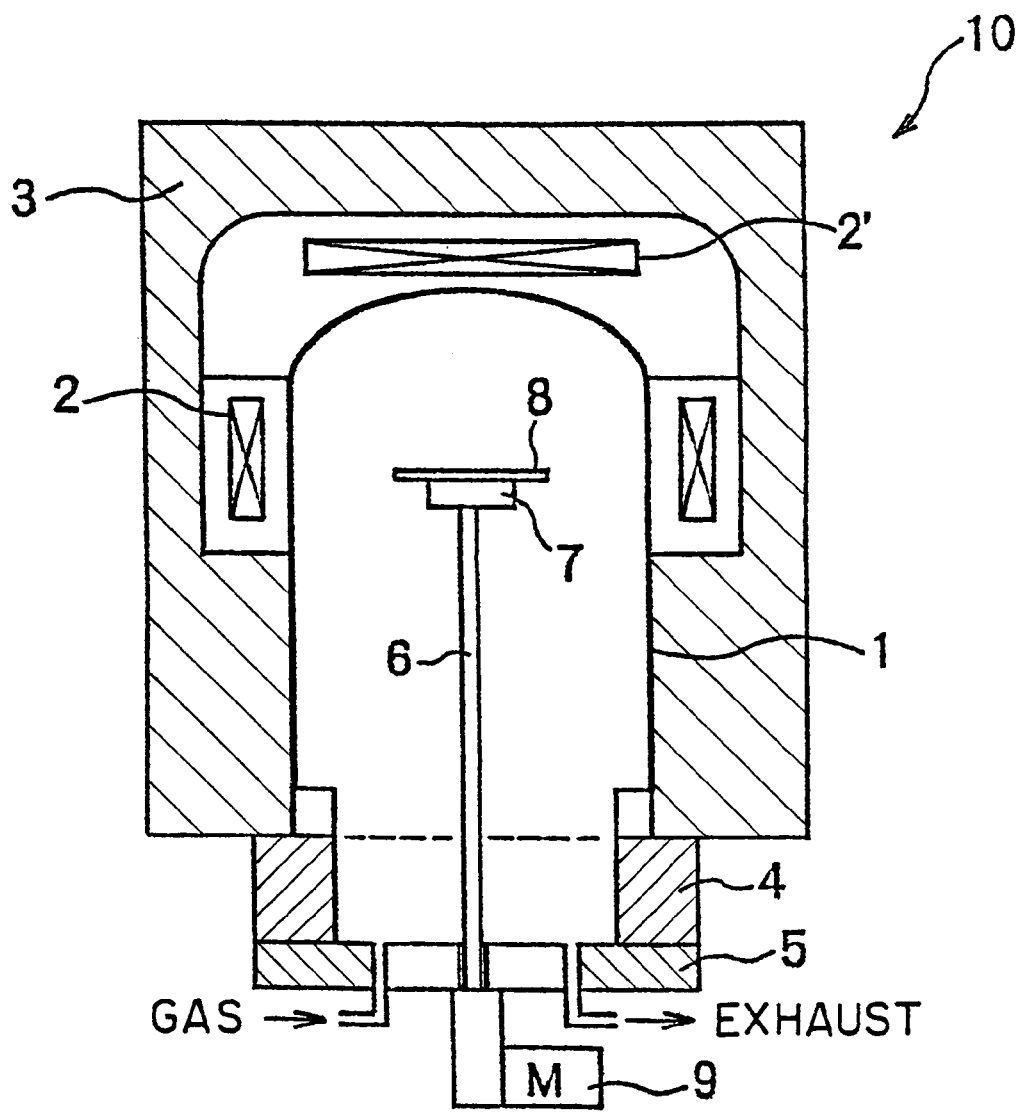
FIG. 3 is a schematic sectional view showing an exemplary RTA for carrying out the method for heat treatment of SOI wafers of the present invention.

FIG. 3 is a schematic sectional view showing an RTA used in the present invention for heat treatment of SOI wafers.

In FIG. 3, a heat treatment apparatus 10 includes a bell jar 1 made of, for example, silicon carbide or quartz. A SOI wafer is heat-treated within the bell jar 1. Heaters 2 and 2' are arranged so as to enclose the bell jar 1 and are used to heat the wafer. The upper heater 2' is separated from the lower heater 2, so that power supplied to the upper heater 2' can be controlled independently of power supplied to the lower heater 2. Of course, a heating system is not limited thereto; radiation heating or radio-frequency induction heating may be employed. A housing 3 is disposed outside the heaters 2 and 2' so as to serve as a thermal shield.

A water-cooled chamber 4 and a base plate 5 are disposed underneath the bell jar 1, to thereby isolate the interior of the bell jar 1 from the atmosphere. A wafer 8 is held on a stage 7. The stage 7 is attached to the top end of a support shaft 6, which is driven by a motor 9 to move vertically. The water-cooled chamber 4 has an unillustrated wafer inlet/outlet port formed therein so that a wafer can be horizontally loaded into or unloaded from the water-cooled chamber 4. The wafer inlet/outlet port is closed or opened by a gate valve. The base plate 5 has a gas inlet and an exhaust outlet so as to enable adjustment of a gas atmosphere within the bell jar 1.

Through use of the above heat treatment apparatus 10, an SOI wafer is heat treated in the following manner.

First, the interior of the bell jar 1 is heated by the heaters 2 and 2' to a desired temperature; for example, a temperature of 1100° C. to 1300° C., and is held at the temperature. Through independent control of power supplied to the separate heaters 2 and 2', there can be established a desired temperature distribution within the bell jar 1 along the height direction there. Accordingly, heat treatment temperature for a wafer can be adjusted by means of the position of the stage 7, or the amount of insertion of the support shaft 6 into the bell jar 1.

When the interior of the bell jar 1 is maintained at a desired temperature, an SOI wafer is loaded into the water-cooled chamber 4 through the wafer inlet/outlet port formed in the water-cooled chamber 4, through use of an unillustrated wafer handling apparatus located adjacent to the heat treatment apparatus 10. The thus-loaded SOI wafer is placed on the stage 7, which stands by at the lowest position of its vertical movement stroke, via, for example, an SiC boat. Since the water-cooled chamber 4 and the base plate 5 are water-cooled, the SOI wafer situated within the water-cooled chamber 4 is not heated to high temperature.

Upon completion of placing of the SOI wafer on the stage 7, the support shaft 6 is immediately driven by the motor 9 and inserted into the bell jar 1 so as to raise the stage 7 to a position corresponding to a desired temperature in the range of 1100° C. to 1300° C., thereby subjecting the SOI wafer placed on the stage 7 to high-temperature heat treatment. In this case, the SOI wafer is moved in only about 20 seconds, for example, from the lowest standby position of the stage 7 located within the water-cooled chamber 4 to a position corresponding to the desired temperature. Thus, the SOI wafer is heated rapidly.

Then, the stage 7 is held stationary at the position corresponding to the desired temperature for a predetermined time (1 sec to 60 sec), thereby subjecting the SOI wafer to high-temperature heat treatment for the predetermined time. After the elapse of the predetermined time, the support shaft 6 is immediately driven by the motor 9 and withdrawn from the bell jar 1, thereby lowering the stage 7 to the lowest standby position located within the water-cooled chamber 4. This lowering motion can also be completed in about 20 sec, for example. Thus, the SOI wafer on the stage 7 is cooled rapidly, since the water-cooled chamber 4 and the base plate 5 are water-cooled. Finally, the SOI wafer is unloaded from the water-cooled chamber 4 through use of the wafer handling apparatus, thereby completing the heat treatment.

When additional SOI wafers are to be heat-treated, since the heat treatment apparatus 10 is held at the heat treatment temperature, the wafers may be loaded, one by one, into the heat treatment apparatus 10 to continuously undergo the heat treatment.

SOI wafers were heat-treated through single-wafer processing in an atmosphere of 100% hydrogen through use of the above-described RTA. In this case, argon may be added in order to adjust the reducing power of hydrogen or to increase safety.

The heat treatment was performed within the temperature range of 1100° C. to 1300° C. for 1 sec to 30 sec. SOI wafers used in the experiment were manufactured as follows. A silicon ingot produced in accordance with the Czochralski method was sliced to obtain two silicon monocrytalline wafers having a diameter of 8 inches and crystal orientation <100>, which were then mirror polished. Subsequently, an oxide film was formed on one wafer (bond wafer) that would become an SOI layer, and was brought into close contact with and bonded to the other wafer (base wafer). Subsequently, the thickness of the bond wafer was decreased in order to form a thin film on the base wafer.

Before undergoing the heat treatment, the density of COPs on the surface of the SOI wafer was measured, through which COPs were confirmed to be present on the surface at a density of about 10 particles/cm$^2$. Since the COP density of an SOI wafer cannot be measured through use of a particle counter that is generally used for ordinary silicon wafers, the COP density was calculated through use of a procedure described below in which defects in the buried oxide layer are observed in accordance with an HF dip method. This procedure allows observation of COPs having at least a size such as to penetrate the SOI layer, as etch pits formed in the buried oxide layer.

Figure 2:
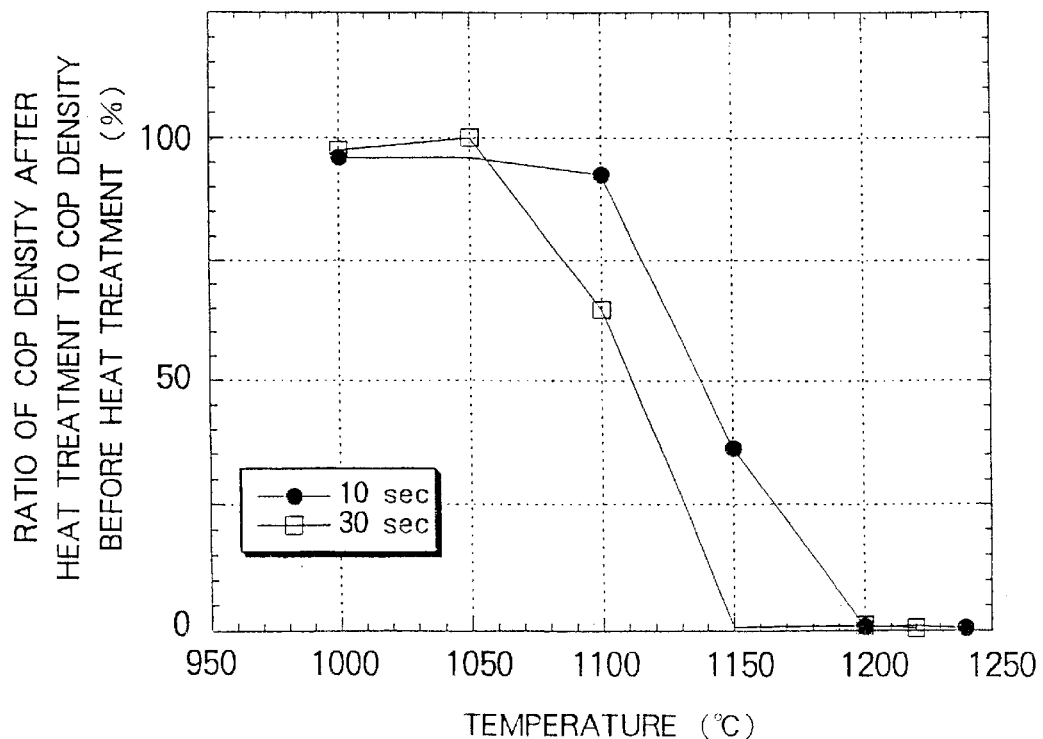
FIG. 2 is a graph showing the relationship between the COP density after heat treatment performed through use of the RTA and the temperature of the heat treatment, measured for each of two different values of heat treatment time.

FIG. 2 shows the relationship between the heat treatment temperature and the ratio of the COP density of the SOI layer after the above-described heat treatment to the COP density of the SOI layer before the above-described heat treatment.

As is understood from FIG. 2, the number of COPs decreases as the heat treatment temperature is made equal to or greater than 1100° C., especially greater than 1200° C., and as the heat treatment time is increased to 10 seconds or longer, especially as long as 30 seconds. Therefore, heat treatment under such conditions are expected to greatly improve device characteristics.

Satisfactory results are obtained when heat treatment is performed for a period of time as long as 30 seconds. Although heat treatment may be performed for about 60 seconds for assurance, the effect of improving the device characteristics and the like is not enhanced through heat treatment for a period of time longer than 60 seconds, and throughput is lowered.

By contrast, when heat treatment is performed in a hydrogen atmosphere at a temperature not greater than 1200° C. for a long period of time (i.e., under conventional heat treatment conditions); for example, at 1100° C. for 2 hours, the COP density decreases to 9 particles/cm$^2$, which indicates that the number of COPs scarcely decreases.

From the above-described facts, it is understood that the effect of decreasing COPs present on the surface of the SOI layer is enhanced as the heat treatment temperature is increased and as the treatment time is decreased to fall within the range of 1 to 60 seconds.

As described above, when heat treatment is performed in a hydrogen atmosphere at a higher temperature and for a shorter period of time than in conventional techniques, COPs can be reduced greatly, without an SOI layer or a buried oxide layer being etched, so that not only TZDB of oxide film of the SOI wafer but also other electrical characteristics such as TDDB thereof can be improved.

As described above, an RTA used in the present invention was found to be considerably effective in heat treatment of SOI wafers, because of the following reasons.

That is, whereas etching of a buried oxide layer during hydrogen annealing occurs to a remarkable extent from about 1000° C., elimination of COPs does not occur unless the treatment temperature is equal to or greater than 1100° C. In the case of, for example, a conventional vertical-type furnace whose temperature elevation rate is low, some length of time is required for reaching a target temperature above 1100° C. Therefore, hydrogen invades through COPs penetrating the SOI layer until reaching a target temperature, so that the oxide layer is etched. In such as case, by the time the treatment temperature reaches a higher temperature where COPs disappear, etch pits have already been formed in the oxide layer.

By contrast, in the case of an RTA, since the treatment temperature increases very quickly and the time required for reaching the temperature where COPs disappear is considerably short, the oxide layer is heated to a high temperature without the oxide layer being etched, even if COPs penetrating the SOI layer are present, whereby COPs disappear.

Even in a vertical-type furnace whose temperature elevation rate is low, action and effects similar to the above-described action and effects of the present invention can be achieved when the temperature elevation to 1100° C. is performed in an atmosphere of an inert gas such as argon, and hydrogen is added when the temperature exceeds 1100° C. However, the vertical-type furnace is inferior to the RTA from the viewpoint of throughput and an amount of hydrogen gas to be used.

EXAMPLES

The present invention will next be described by way of example, which should not be construed as limiting the invention.

Example (1) Fabrication of SOI Wafer

Two 8-inch silicon wafers that had been sliced from an ingot pulled in accordance with the CZ method and had an orientation of <100> were used for fabrication of an SOI wafer. An oxide film of 0.2 $\mu$m thick was formed on a wafer (bond wafer) that would become an SOI layer, and the bond wafer was brought into close contact with a base wafer. These wafers were then subjected to bonding heat treatment at 1100° C. for two hours so as to obtain a bonded wafer. The bonded wafer was then subjected to grinding, polishing, and gas phase etching to obtain an SOI wafer having an SOI layer of about 0.1 $\mu$m thickness. Six SOI wafers were fabricated in the above-described manner, two of which were used in Examples, while the remaining four SOI wafers were used in Comparative Examples.

(2) Heat Treatment in Reducing Atmosphere

Through use of the RTA, SHS-2800 (product of AST Corp.), the above-described SOI wafers were subjected to rapid thermal annealing at 1200° C. for 10 sec in an atmosphere of 100% hydrogen.

(3) Measurement of COPs (Observation of Defects in Oxide Layer in Accordance with the HF Dip Method)

When an SOI wafer having a thin SOI layer is immersed into aqueous solution of 50% HF for, for example, 10 minutes, HF reaches the buried oxide layer via defects if they penetrate the SOI layer, with the result that the oxide layer is etched, resulting in formation of etch pits. The etch pits formed in the oxide layer can be observed via the thin SOI layer through use of an optical microscope. During observation through use of the optical microscope in the Embodiment, the surface of the SOI wafer was scanned in the diametric direction of the wafer surface, and the number of pits in a total area of about 10 $cm^2$ was measured.

(4) Results of Measurement

Figure 1:
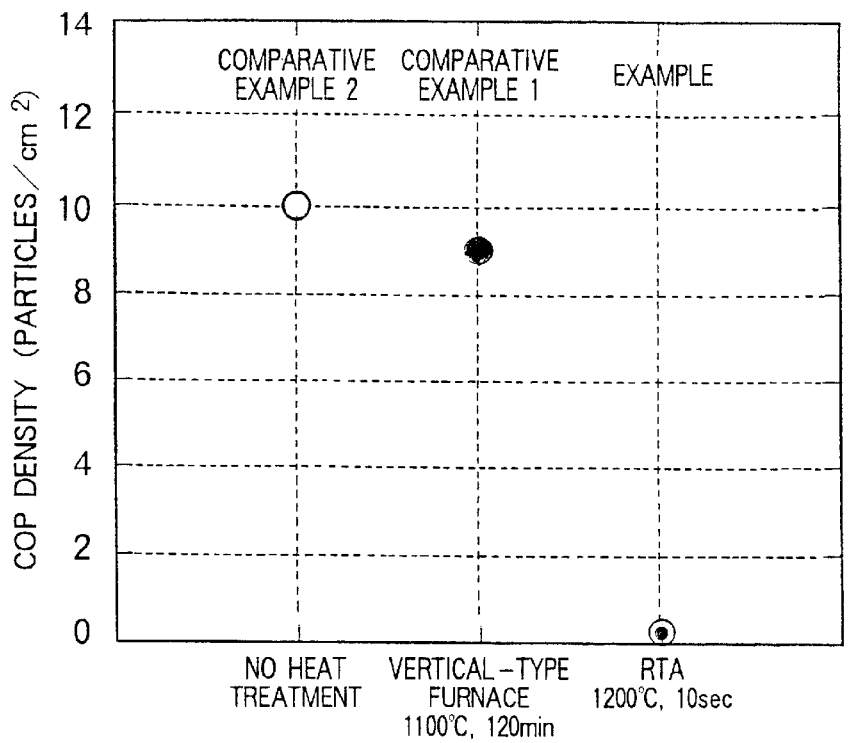
FIG. 1 is a graph showing results of comparison among a COP density before the heat treatment of the present invention is performed (Comparative Example 2), a COP density after the heat treatment of the present invention is performed through use of an RTA (Example), and a COP density after a conventional heat treatment is performed (Comparative Example 1)

One pit was observed on each wafer, which means that each wafer had a COP density of 0.1 particles/$cm^2$ (see FIG. 1). Further, after the heat treatment, the SOI layer had a thickness of 0.1 $\mu$m and the buried oxide layer had a thickness of 0.2 $\mu$m, the same thicknesses as before the heat treatment.

Comparative Example 1

Heat treatment and measurement of SOI wafers were performed under the same conditions as those for the Example, except that a conventional batch-type vertical furnace was used as a heat treatment apparatus, and heat treatment was performed at 1100° C. for two hours. On one wafer 86 pits were observed, while on another wafer 93 pits were observed, which meant that the COP density decreased only to about 9 particles/$cm^2$ (see FIG. 1). Further, during the heat treatment, the SOI layer was etched to a thickness of 0.07 $\mu$m, and the buried oxide layer was etched at locations where COPs were present, so that pits were formed.

Comparative Example 2

Ninety-nine pits were observed on SOI wafers before the wafers were subjected to the heat treatment of the present invention, while 102 pits were observed on SOI wafers before the wafers were subjected to the heat treatment of Comparative Example 1. Therefore, the average COP density was 10 particles/$cm^2$.

The present invention is not limited to the above-described embodiment. The above-described embodiment is a mere example, and those having the substantially same structure as that described in the appended claims and providing the similar action and effects are included in the scope of the present invention.

For example, the above-described embodiment, a description is given of heat treatment for so-called bonded SOI wafers in which two silicon monocrystalline wafers are bonded together via a silicon oxide film. However, the present invention is not limited thereto and is applicable to SOI wafers fabricated through a method in which a silicon wafer and an insulator wafer are bonded together to form an SOI wafer, as well as to SOI wafers fabricated through a so-called smart cut method in which a silicon wafer is bonded to an ion-implanted wafer, which is then delaminated at the ion-implanted portion to obtain an SOI wafer.

Further, the above-described embodiment uses the heat treatment apparatus as shown in FIG. 3. However, an apparatus for carrying out the invention is not limited thereto; any kind of heat treatment apparatus may be used so long as the apparatus can rapidly heat and cool an SOI wafer and can heat the SOI wafer to 1100° C. or more.

What is claimed is:

1. A method for heat-treating an SOI wafer, comprising the steps of:

providing an SOI wafer whose SOI layer is a silicon single crystal produced by the CZ method;

placing the SOI wafer in a reducing atmosphere; and heat-treating the SOI wafer through use of a rapid thermal annealer at a temperature within the range of 1100° C.–1300° C. for 1 sec to 60 sec.

2. A method for heat-treating an SOI wafer according to claim 1, wherein said reducing atmosphere is an atmosphere of 100% hydrogen or a mixed gas atmosphere containing hydrogen and argon.

3. A method for heat-treating an SOI wafer according to claim 1, wherein said heat treatment is performed for 1 sec to 30 sec.

4. A method for heat-treating an SOI wafer according to claim 2, wherein said heat treatment is performed for 1 sec to 30 sec.

* * * * *